US011037287B2

(12) United States Patent
Huang et al.

(10) Patent No.: US 11,037,287 B2
(45) Date of Patent: Jun. 15, 2021

(54) METHOD FOR MEASURING CRITICAL DIMENSION AND IMAGE-PROCESSING APPARATUS FOR MEASURING CRITICAL DIMENSION

(71) Applicant: WINBOND ELECTRONICS CORP., Taichung (TW)

(72) Inventors: Ching-Ya Huang, Taichung (TW); Tso-Hua Hung, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 184 days.

(21) Appl. No.: 16/398,045

(22) Filed: Apr. 29, 2019

(65) Prior Publication Data

US 2019/0347781 A1 Nov. 14, 2019

(30) Foreign Application Priority Data

May 9, 2018 (TW) .................. 107115736

(51) Int. Cl.
| | |
|---|---|
| *G06T 7/00* | (2017.01) |
| *G06T 7/13* | (2017.01) |
| *G06T 7/50* | (2017.01) |
| *G06T 5/00* | (2006.01) |
| *G06T 5/20* | (2006.01) |

(Continued)

(52) U.S. Cl.
CPC ............ *G06T 7/0004* (2013.01); *G06T 5/002* (2013.01); *G06T 5/003* (2013.01); *G06T 5/20* (2013.01); *G06T 7/13* (2017.01); *G06T 7/187* (2017.01); *G06T 7/50* (2017.01); *H01J 37/222* (2013.01); *H01J 37/28* (2013.01); *G06T 2207/10061* (2013.01); *G06T 2207/20061* (2013.01); *G06T 2207/20156* (2013.01); *G06T 2207/30148* (2013.01); *H01J 2237/2813* (2013.01)

(58) Field of Classification Search
CPC ............ G01N 21/211; G06T 7/12; G06T 7/13
See application file for complete search history.

(56) References Cited

U.S. PATENT DOCUMENTS

| | | | | |
|---|---|---|---|---|
| 5,311,600 | A | * | 5/1994 | Aghajan .............. G06K 9/4604 382/156 |
| 6,408,105 | B1 | | 6/2002 | Maruo |

(Continued)

FOREIGN PATENT DOCUMENTS

CN 101303226 A 11/2008

OTHER PUBLICATIONS

A Chinese Office Action, with English translation of the Search Report issued in corresponding application No. 201810554313.X dated Nov. 24, 2020, 11 pages.

*Primary Examiner* — Joshua L Schwartz
(74) *Attorney, Agent, or Firm* — Muncy, Geissler, Olds & Lowe, P.C.

(57) ABSTRACT

A method for measuring critical dimension is provided. The method includes the steps of: receiving a critical-dimension scanning electron microscopy (CD-SEM) image of a semiconductor wafer; performing an image-sharpening process and an image de-noise process on the CD-SEM image to generate a first image; performing an edge detection process on the first image to generate a second image; performing a connected-component labeling process on the second image to generate an output image; and calculating a critical-dimension information table of the semiconductor wafer according to the output image.

20 Claims, 5 Drawing Sheets

(51) Int. Cl.
*H01J 37/22* (2006.01)
*H01J 37/28* (2006.01)
*G06T 7/187* (2017.01)

(56) References Cited

U.S. PATENT DOCUMENTS

| | | | |
|---|---|---|---|
| 7,859,659 B2* | 12/2010 | Xu | G01N 21/211 |
| | | | 356/300 |
| 8,110,814 B2* | 2/2012 | Ward | B82Y 10/00 |
| | | | 250/423 F |
| 2006/0108525 A1* | 5/2006 | Nakagaki | H01J 37/28 |
| | | | 250/310 |
| 2009/0032707 A1 | 2/2009 | Sato et al. | |
| 2016/0071261 A1 | 3/2016 | Yang et al. | |
| 2017/0345725 A1 | 11/2017 | Hu et al. | |
| 2018/0017875 A1* | 1/2018 | Bibby | G03F 7/70141 |
| 2019/0164303 A1* | 5/2019 | Mack | G06T 5/002 |

\* cited by examiner

| Number of Pixels | Critical Dimension |
|---|---|
| 15 | 156.25 |
| 15 | 156.25 |
| 15 | 156.25 |
| 14 | 145.8333 |
| 14 | 145.8333 |
| 14 | 145.8333 |
| 14 | 145.8333 |
| 13 | 135.4167 |
| 13 | 135.4167 |
| 13 | 135.4167 |
| 12 | 125 |
| 12 | 125 |
| 11 | 114.5833 |
| 11 | 114.5833 |
| 11 | 114.5833 |
| 10 | 104.1667 |
| 10 | 104.1667 |
| 10 | 104.1667 |
| 10 | 104.1667 |
| 10 | 104.1667 |
| ⋮ | ⋮ |
| 10 | 104.1667 |
| 10 | 104.1667 |
| 10 | 104.1667 |
| 10 | 104.1667 |
| 11 | 114.5833 |
| 11 | 114.5833 |
| 12 | 125 |
| 12 | 125 |
| 12 | 125 |
| 12 | 125 |
| 12 | 125 |

400

| | 1 | 2 | 3 | 4 | 5 | 6 |
|---|---|---|---|---|---|---|
| 1 | 65.77 | 40.39 | 0 | 61.86 | 59.36 | 56.59 |
| 2 | 66.67 | 64.117 | 0 | 59.66 | 53.42 | 53.605 |
| 3 | 65.288 | 67.17 | 62.17 | 65.88 | 53.627 | 53.46 |
| 4 | 63.19 | 66.15 | 62.97 | 64.88 | 53.45 | 66.63 |
| 5 | 61.95 | 65.87 | 61.58 | 65.69 | 59.82 | 67.42 |
| 6 | 61.53 | 0 | 57.403 | 0 | 54.99 | 68.81 |

FIG. 4

METHOD FOR MEASURING CRITICAL DIMENSION AND IMAGE-PROCESSING APPARATUS FOR MEASURING CRITICAL DIMENSION

CROSS REFERENCE TO RELATED APPLICATIONS

This Application claims priority of Taiwan Patent Application No. 107115736, filed on May 9, 2018, the entirety of which is incorporated by reference herein.

BACKGROUND OF THE INVENTION

Field of the Invention

The present invention relates to image processing, and, in particular, to a method for measuring critical dimension and an image-processing apparatus for measuring critical dimension.

Description of the Related Art

In conventional semiconductor-wafer manufacturing, scanning electron microscopes (SEM) are used to measure critical-dimension values. However, the semiconductor/integrated circuit industry has experienced exponential growth. With the advent of new materials and design techniques for integrated circuits, several generations of integrated circuits have been developed, and each generation has smaller and more complex circuits than the previous generation. The shrinking process of integrated circuits generally improves production efficiency and reduces costs, but it also increases the complexity of processing and manufacturing the integrated circuits, such as the shrinking width of metal wires and the increasing complexity of the graphics in the SEM image. Accordingly, the cost of the measuring equipment has become higher and the required measuring time has become longer. While building the optical-proximity-correction (OPC) model, a lot of critical-dimension measurement data of the after-development-inspection (ADI) and after-etch-inspection (AEI) are required, thereby providing best correction to the layout patterns. The critical-dimension measurement data directly affects the calibration values of the mask, and is also responsible for the electrical properties of the product design. Additionally, the conventional SEM measures the patterns of the integrated circuit on the wafer using the reflective electron beam, and the patterns may easily be affected by the slope and shape of the electron beam, and noises, resulting in measurement errors.

BRIEF SUMMARY OF THE INVENTION

A detailed description is given in the following embodiments with reference to the accompanying drawings.

In an exemplary embodiment, a method for measuring critical dimension is provided. The method includes the steps of: receiving a critical-dimension scanning electron microscopy (CD-SEM) image of a semiconductor wafer; performing an image-sharpening process and an image de-noise process on the CD-SEM image to generate a first image; performing an edge detection process on the first image to generate a second image; performing a connected-component labeling process on the second image to generate an output image; and calculating a critical-dimension information table of the semiconductor wafer according to the output image.

In another exemplary embodiment, an image-processing apparatus for measuring critical dimension is provided. The image-processing apparatus includes a memory unit and a processor. The memory unit is configured to store a critical-dimension measuring program. The processor is configured to execute the critical-dimension measuring program to perform the steps of: receiving a critical-dimension scanning electron microscopy (CD-SEM) image of a semiconductor wafer; performing an image-sharpening process and an image de-noise process on the CD-SEM image to generate a first image; performing an edge-detection process on the first image to generate a second image; performing a connected-component labeling process on the second image to generate an output image; and calculating a critical-dimension information table of the semiconductor wafer according to the output image.

BRIEF DESCRIPTION OF THE DRAWINGS

The present invention can be more fully understood by reading the subsequent detailed description and examples with references made to the accompanying drawings, wherein:

FIG. 4 is a diagram of the critical-dimension values of different dies on the semiconductor wafer in accordance with an embodiment of the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
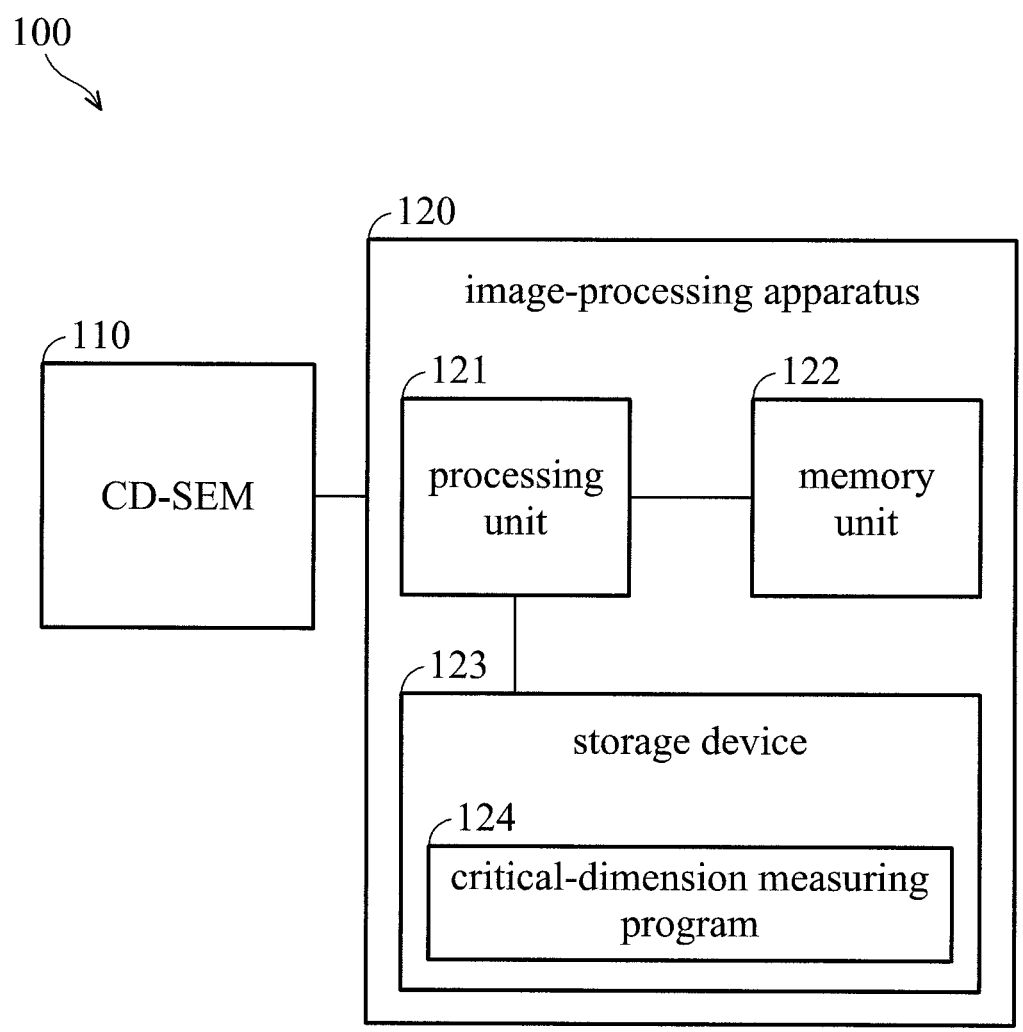
FIG. 1 is a block diagram of an image processing system 100 in accordance with an embodiment of the invention.

FIG. 1 is a block diagram of an image processing system 100 in accordance with an embodiment of the invention. In an embodiment, the image processing system 100 includes a critical-dimension scanning electron microscope (CD-SEM) 110 and an image-processing apparatus 120. The CD-SEM 110 is configured to photograph a semiconductor wafer to obtain a CD-SEM image. The image-processing apparatus 120 is configured to measure critical dimension (CD) of the semiconductor wafer. For example, the image-processing apparatus 120 may obtain the CD-SEM image (e.g., a gray image) from the CD-SEM 110, perform image processing on the CD-SEM image to obtain the shape of the layout on the CD-SEM image, such as top-view contours of the outer boundary, and bottom-view contours of the inner boundary.

As illustrated in FIG. 1, the image-processing apparatus 120 includes a processing unit 121, a memory unit 122, a storage device 123. The storage device 123 may be a non-volatile memory such as a hard disk drive, a solid-state disk, a flash memory, a read-only memory (ROM), etc., but the invention is not limited thereto. The storage device 123 is configured to store a critical-dimension measuring program 124, wherein the critical-dimension measuring program 124 includes program codes for performing image processing on the CD-SEM image to obtain the contours of the layout or objects in the CD-SEM image, and the details will be described later.

The processing unit 121, for example, may be a central processing unit (CPU), a general-purpose processor, or an image signal processor (ISP), but the invention is not limited thereto. The processing unit 121 may load the critical-dimension measuring program 124 stored in the storage device 123 to the memory unit 122 for execution, thereby obtaining the contours of the layout or objects from the CD-SEM image. In an embodiment, the memory unit 122 may be a volatile memory such as a dynamic random access memory (DRAM), but the invention is not limited thereto.

For example, in an embodiment, after the image-processing apparatus 120 executes the critical-dimension measuring program 124 to obtain the contours of objects in the CD-SEM image, the image-processing apparatus 120 may analyze the contours of objects to obtain the critical-dimension values on different locations of the layout on the semiconductor wafer, thereby outputting a critical-dimension information table.

In another embodiment, the image-processing apparatus 120 may retrieve a layout file (e.g., a first layout file) of the semiconductor wafer, such as a graphics data system file in the GDS or GDSII format, and incorporate the obtained contours of the layout or objects into the obtained layout file to output another layout file (e.g., a second layout file) having the contours of the layout or objects.

Figure 2:
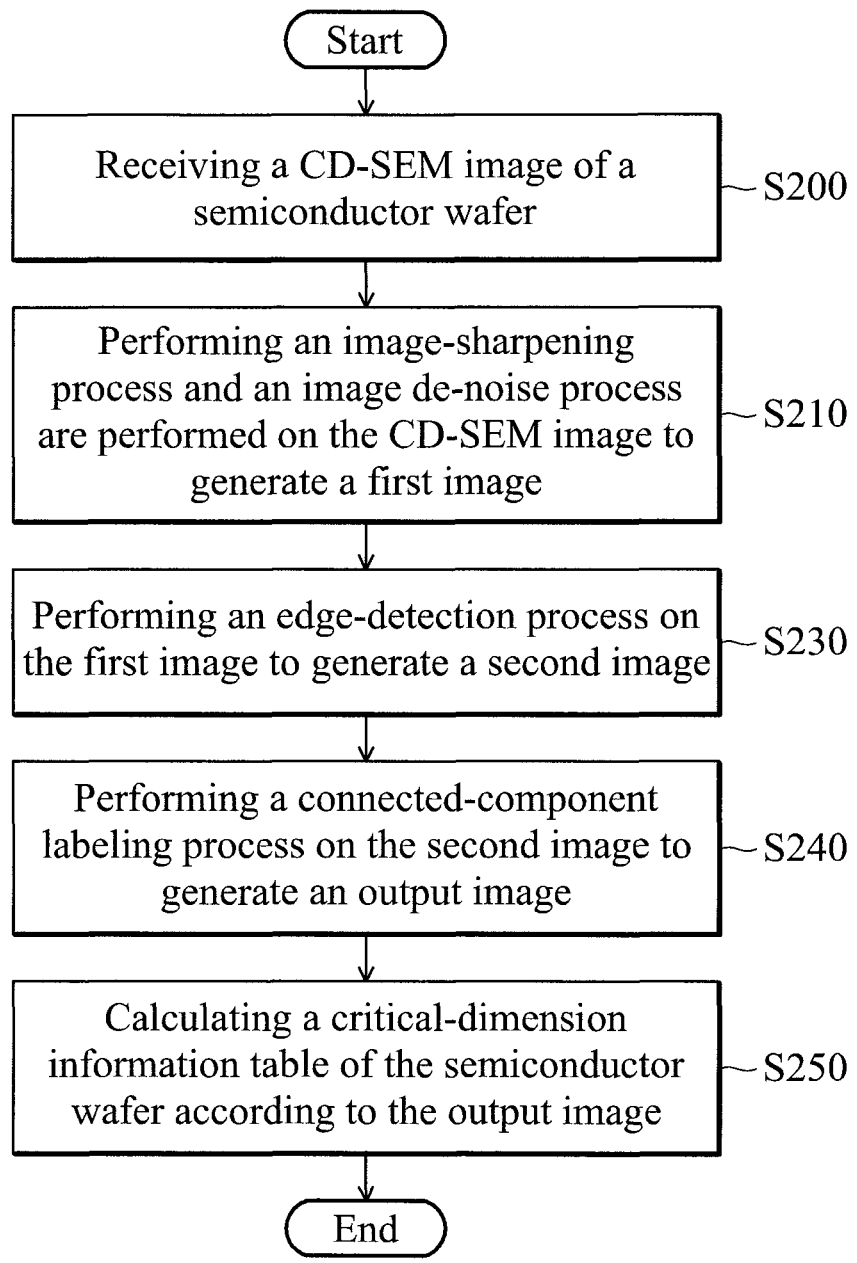
FIG. 2 is a flow chart of a method for measuring critical dimension in accordance with an embodiment of the invention.

FIG. 2 is a flow chart of a method for measuring critical dimension in accordance with an embodiment of the invention. In step S200, a CD-SEM image of a semiconductor wafer is received. For example, the CD-SEM image can be obtained by photographing the semiconductor wafer using the CD-SEM 110. For example, the CD-SEM image may be a top-view image or a sectional side-view image of the semiconductor wafer. In an embodiment, the CD-SEM image may be a gray-level image. If the CD-SEM 110 outputs an image in the JPG (Joint Photographic Experts Group) format or TIFF (Tagged Image File Format) format, the image-processing apparatus 120 may convert output image from the CD-SEM 110 to a gray-level image as the CD-SEM image.

In step S210, an image-sharpening process and an image de-noise process are performed on the CD-SEM image to generate a first image. In an embodiment, the image-processing apparatus 120 may apply a Butterworth high-pass filter on the CD-SEM image to perform the image-sharpening process, wherein the cut-off frequency and the order of the Butterworth high-pass filter can be determined according to practical conditions. In another embodiment, the image-processing apparatus 120 may use other types of frequency-domain high-pass filters to perform the image-sharpening process on the CD-SEM image, such as the discrete wavelet transform (DWT) high-pass filter, Gaussian high-pass filter, Laplace high-pass filter, etc., but the invention is not limited thereto.

Additionally, the image-processing apparatus 120 may apply the Gaussian high-pass filter to an intermediate image generated by the image-sharpening process to perform the image de-noise process, wherein the Gaussian high-pass filter may be a 5×5 filter mask, and its standard deviation sigma can be set to a predetermined value (e.g., 2), but the invention is not limited thereto. In some embodiments, the order of the image-sharpening process and the image de-noise process can be exchanged. For example, the image de-noise process can be performed on the CD-SEM image to generate the intermediate image, and the image-sharpening process is performed on the intermediate image.

Specifically, since the CD-SEM image generally has a high noise level and poor image quality, in order to precisely measure the critical-dimension values, a frequency-domain image-sharpening process and image de-noise process should be performed on the CD-SEM image for convenience of the subsequent image processing.

In step S230, an edge-detection process is performed on the first image to generate a second image. For example, the aforementioned edge-detection process may perform the "Hough Transform" on the first image to obtain edges of the first image to generate the second image, wherein the second image may be a binary image. If the pixel value of a specific pixel in the second image is 1, it indicates that there is an image edge on the location of the specific pixel. If the pixel value of a specific pixel in the second image is 0, it indicates that there is no image edge on the location of the specific pixel.

In step S240, a connected-component labeling process is performed on the second image to generate an output image. For example, the connected-component labeling process includes a connected-component labeling algorithm (e.g., 4-connectivity or 8-connectivity algorithms) and a region-growing algorithm that are performed in a predetermined order (e.g., raster scan) on each pixel of the second image to generate the output image, wherein the output image includes the contours of multiple objects on the semiconductor wafer, such as metal wires, contacts in the layout of the semiconductor wafer. In some embodiments, the connected-component labeling process in step S240 may include the following steps: selecting a seed pixel from the second image, performing the region-growing process on the selected seed pixel as the center (e.g., the center of a processing mask), and determining whether one or more neighboring pixels of the seed pixel have similar characteristics as the seed pixel (e.g., the similarity between the neighboring pixels and the seed pixel is larger than a predetermined threshold). When the neighboring pixels of the seed pixel have similar characteristics as the seed pixel, the neighboring pixels having the similar characteristics are labeled as the same region. Then, one of the neighboring pixels in the same region is selected and defined as a new seed pixel, and the process goes on based on the new seed pixel. The process is repeatedly performed to detect the neighboring pixels that have been classified into any region until all pixels of the second pixels have been classified.

In step S250, a critical-dimension information table of the semiconductor wafer is calculated base on the output image. For example, in an embodiment, the output image includes the contours of multiple objects on the semiconductor wafer, and the image-processing apparatus 120 may obtain the critical-dimension pixel-distance information between different objects according to the contours of the objects in the output image. For example, the contours of the outer boundary of the metal wires in the layout are labeled. Then, the image-processing apparatus 120 may calculate the critical-dimension pixel-distance information between every two neighboring metal wires, and each of the calculated critical-dimension values is expressed in the numbers of pixels.

Then, the image-processing apparatus 120 may perform a pixel-to-distance conversion on the critical-dimension pixel-distance information to obtain the critical-dimension information. For example, the CD-SEM 110 may photograph the semiconductor wafer with a predetermined field of view (FoV) and a predetermined image resolution, and thus the captured range on the semiconductor wafer can be converted to a corresponding number of pixels. For purposes of description, the aforementioned image resolution may be 480×480 (not limited) that corresponds to a predetermined range of an 8" semiconductor wafer. Thus, the critical-dimension pixel-distance information can be converted to an actual distance which is regarded as the critical dimension. Accordingly, the image-processing apparatus 120 may build the critical-dimension information table of the semiconductor wafer according to the calculated critical-dimension values.

A conventional CD-SEM analyzes the critical dimension between the peak and the valley of the white boundaries in the CD-SEM image rather than measuring the critical dimension between the neighboring metal wires, and thus it may cause measurement errors of the critical-dimension values while measuring the CD-SEM image with a high noise level. In addition, while photographing the CD-SEM image, the semiconductor wafer is covered with photoresist on predetermined locations. A portion of the photoresist covered on the semiconductor wafer is consumed after the semiconductor wafer is photographed by the CD-SEM. If the semiconductor wafer is repeatedly photographed by the CD-SEM several times, the output CD-SEM images may be not consistent. If the critical-dimension values between neighboring metal wires (or other components) in the CD-SEM image are measured manually, the critical-dimension values are measured by subjectively labeling the measure points on the estimated boundaries of the metal wires, resulting in inconsistent measurements of the critical-dimension values. In addition, the metal wires or other objects in the layout are not rendered as perfect straight lines or rectangles, and thus it is very difficult to objectively measure the critical-dimension values in the conventional way.

In comparison with the conventional method, the method for measuring critical dimension in the embodiment of FIG. 2 is capable of quickly eliminating the noises of the CD-SEM image using image processing, and labeling the contours of the objects in the layout to analyze the critical-dimension values at different locations on the semiconductor wafer. Since the analysis is performed using image processing, the critical-dimension values can be objectively measured.

Figure 3:
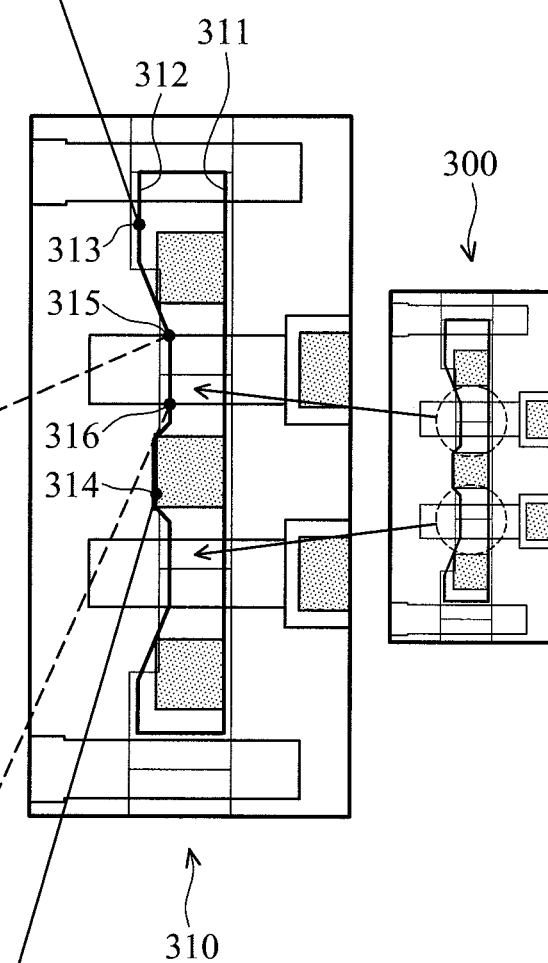
FIG. 3 is a diagram of a layout file having the layout contours in accordance with an embodiment of the invention.

FIG. 3 is a diagram of a layout file having the layout contours in accordance with an embodiment of the invention. In an embodiment, while building the optical proximity correction (OPC) model, a lot of critical dimension measurement data of the after-development-inspection (ADI) and after-etch-inspection (AEI) are required, thereby providing best correction to the layout patterns. For example, the image-processing apparatus 120 may obtain the layout file (e.g., a first layout file) associated with the semiconductor wafer, and the incorporate the contours of objects (e.g., can be obtained from the CD-SEM image from ADI or AEI), that are obtained by the method for measuring critical dimension described in the embodiment of FIG. 2, into the layout file, and output another layout file (e.g., second layout file) having the contours of objects.

As illustrated in FIG. 3, there are many components in the shape of rectangles or squares in the partially enlarged image 310 of the second layout file 300, and the rectangles and squares are the layout in the first layout file generated by a corresponding layout tool. In the partially enlarged image 310, the curves 311 and 312 are the outer contours of two neighboring metal wires. For example, the metal wires corresponding to the curves 311 and 312 are expected to be straight lines in the first layout file. However, after etching, the curve 312 is not a straight line, and thus the critical-dimension values between the curves 311 and 312 are not kept at a fixed value. The image-processing apparatus 120 may calculate the critical-dimension values in the region between the points 311 and 314, and build the partial critical-dimension information table 320.

The partial critical-dimension information table 320 records the number of pixels and corresponding critical-dimension values between the outer contours of two neighboring metal wires (e.g., curves 311 and 312). For example, when the number of pixels is 15, the corresponding critical-dimension value is 156.25 nm; when the number of pixels is 14, the corresponding critical-dimension value is 145.8333 nm, and so on. It should be noted that the relationships between the number of pixels and the corresponding critical-dimension value in the region between points 315 and 316 are shown in the partial critical-dimension information table 330, wherein the number of pixels may be the critical-dimension pixel distance as described in the aforementioned embodiments, and can be converted into an actual critical-dimension value. For example, the number of pixels is 10 in the partial critical-dimension information table 330, and its corresponding critical-dimension value is 104.1667 nm, which is the actual critical dimension in the partially enlarged image 310.

In addition, the image-processing apparatus 120 may calculate critical-dimension information at different locations according to the layout file having the contours of objects, and build the critical-dimension information table of the semiconductor wafer. Thus, the designer may correct the mask for the semiconductor wafer or adjust the recipe of the manufacturing processes of the semiconductor wafer according to the critical-dimension information table, so that the contours of the layout may better fit the original design of the layout file.

FIG. 4 is a diagram of the critical-dimension values of different dies on the semiconductor wafer in accordance with an embodiment of the invention. In an embodiment, for purposes of description, the FoV of the CD-SEM 110 may include the range of 6×6 dies. Because of the design of semiconductor manufacturing processes, the critical-dimension value of each die on the semiconductor wafer may vary. Using the method in the embodiment of FIG. 2, the critical-dimension (i.e., in nanometers) value corresponding to each die on the semiconductor wafer can be calculated using the critical-dimension information table, and the calculated critical-dimension value of each die is recorded in the corresponding position of each die in the regional die-critical-dimension table 400, wherein the numbers along the X-axis and the Y-axis denote the position of each die within the captured range of the CD-SEM 110. Accordingly, the designer may inspect the critical-dimension value of each die in the regional die-critical-dimension table 400, and check the internal layout of the die having a problematic (unqualified) critical-dimension value, thereby modifying the mask or manufacturing recipe to adjust the critical dimension of the problematic die.

The image-processing apparatus 120 may calculate the critical-dimension value corresponding to each die on the semiconductor wafer according to the critical-dimension information table, and build the die critical-dimension table of the semiconductor wafer according to the critical-dimension value of each die on the semiconductor wafer. In some embodiments, the CD-SEM 110 may calculate the coordinates of the semiconductor wafer mapped from the CD-SEM image. Then, using the method of the aforementioned embodiment of FIG. 2, the image-processing apparatus 120 may build the critical-dimension information table of the CD-SEM image and set a predetermined threshold T such as a critical-dimension value of three times the standard deviation. The image-processing apparatus 120 may calculate the positions of the layout of the mask according to the calculated coordinates. In addition, the critical-dimension values of the contours of different layout detected from the CD-SEM image can be converted from the critical-dimension information table. If the critical-dimension values of one or more locations in the contours of the layout are smaller than the predetermined threshold T, the image-processing apparatus 120 may place corresponding labels on the layout file of the mask to make it more convenient for the designer to handle these issues.

Figure 5:
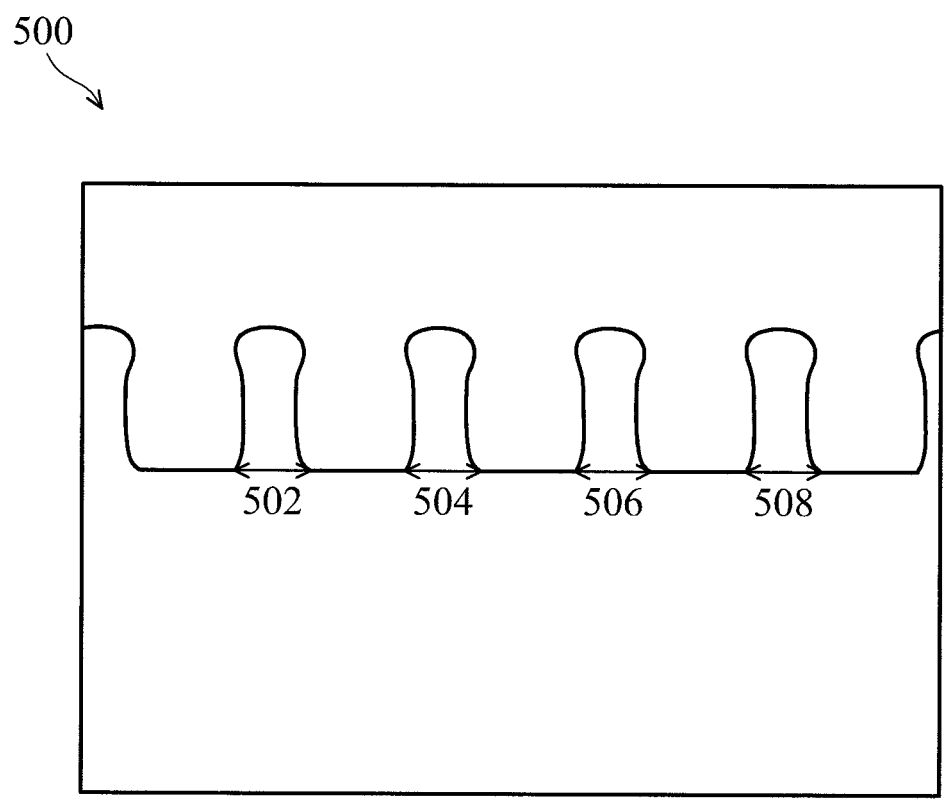
FIG. 5 is a diagram of the CD-SEM image of the cross section of the semiconductor wafer in accordance with an embodiment of the invention.

FIG. 5 is a diagram of the CD-SEM image of the cross section of the semiconductor wafer in accordance with an embodiment of the invention.

In an embodiment, the CD-SEM 110 photographs the cross section of the semiconductor wafer to obtain the CD-SEM 500, which is a side-view of the cross section of the semiconductor wafer, as illustrated in FIG. 5. In the embodiment, the CD-SEM image 500 may be an AEI CD-SEM image. Similarly, the image-processing apparatus 120 may obtain the contours of object in the CD-SEM image 500 using the method described in the aforementioned embodiment, and calculate the critical-dimension values between the contours of objects such as the distances of the intervals 502, 504, 506, and 508 which denote the critical-dimension values between two neighboring metal wires at different locations. For example, currently, a physical failure analysis (PFA) measurement tool requires manually determining the position of boundaries. With advents of semiconductor technologies, the width of metal wires becomes narrower and narrower, and thus a slight shift may cause an error of several nanometers. Accordingly, manual measurements cannot objectively determine the boundaries. Since manual measurements tends to cause errors, and the errors may vary due to subjective determination results of different inspectors. However, the image-processing apparatus and the method for measuring critical dimension provided in the invention may avoid errors caused by manual measurements and increase the consistency for measuring critical-dimension values.

The methods, or certain aspects or portions thereof, may take the form of a program code embodied in tangible media, such as floppy diskettes, CD-ROMs, hard drives, or any other machine-readable (e.g., computer-readable) storage medium, or computer program products without limitation in external shape or form thereof, wherein, when the program code is loaded into and executed by a machine such as a computer, the machine thereby becomes an apparatus for practicing the methods. The methods may also be embodied in the form of program code transmitted over some transmission medium, such as an electrical wire or a cable, or through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application specific logic circuits.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for measuring critical dimension, comprising:
   receiving a critical-dimension scanning electron microscopy (CD-SEM) image of a semiconductor wafer;
   performing an image-sharpening process and an image de-noise process on the CD-SEM image to generate a first image;
   performing an edge-detection process on the first image to generate a second image;
   performing a connected-component labeling process on the second image to generate an output image; and
   calculating a critical-dimension information table of the semiconductor wafer according to the output image,
   wherein the connected-component labeling process comprises:
   selecting a seed pixel from the second image, and perform a region-growing process on the selected seed pixel as a center;
   determining whether one or more neighboring pixels of the seed pixels have similar characteristics as the seed pixel;
   in response to the neighboring pixels of the seed pixels having similar characteristics as the seed pixel, labeling the seed pixel and the neighboring pixels having the similar characteristics as the same region, and selecting one of the neighboring pixels in the same region as a new seed pixel; and
   using the new seed pixel as the center to detect pixels around the new seed pixel that haven't been classified into any region until all pixels in the second image have been classified.

2. The method as claimed in claim 1, wherein the image-sharpening process comprises:
   applying a Butterworth high-pass filter on the CD-SEM image to generate an intermediate image,
   wherein the image-denoise process comprises:
   applying a Gaussian high-pass filter on the intermediate image to generate the first image.

3. The method as claimed in claim 1, wherein the edge-detection process comprises:
   applying a Hough transform on the first image to generate the second image.

4. The method as claimed in claim 1, wherein the connected-component labeling process comprises:
   performing a connected-component labeling algorithm and a region-growing algorithm on each pixel of the second image in a predetermined order to generate the output image.

5. The method as claimed in claim 1, wherein the steps of calculating the critical-dimension information table of the semiconductor wafer according to the output image comprises:

obtaining critical-dimension pixel-distance information between different objects in the output image according to a plurality of contours of the objects in the output image;

performing a pixel-to-distance conversion on the critical-dimension pixel-distance information to obtain critical-dimension information; and building the critical-dimension information table according to the obtained critical-dimension information.

6. The method as claimed in claim 1, wherein the output image comprises contours of a plurality of objects on the semiconductor wafer, and the method further comprising:

obtaining a first layout file associated with the semiconductor wafer;

incorporating the contours of the objects into the first layout file to generate a second layout file;

calculating critical-dimension information of the semiconductor wafer according to the second layout file; and building the critical-dimension information table according to the calculated critical-dimension information.

7. The method as claimed in claim 6, further comprising:

calculating critical-dimension value of each die on the semiconductor wafer according to the critical-dimension information table; and building a die critical-dimension table of the semiconductor wafer according to the critical-dimension value of each die.

8. The method as claimed in claim 1, wherein the CD-SEM image is photographed by the CD-SEM on a cross section of the semiconductor wafer.

9. An image-processing apparatus for measuring critical dimension, comprising:

a memory unit, configured to store a critical-dimension measuring program; and a processor, configured to execute the critical-dimension measuring program to perform the steps of:

receiving a critical-dimension scanning electron microscopy (CD-SEM) image of a semiconductor wafer;

performing an image-sharpening process and an image de-noise process on the CD-SEM image to generate a first image;

performing an edge-detection process on the first image to generate a second image;

performing a connected-component labeling process on the second image to generate an output image; and calculating a critical-dimension information table of the semiconductor wafer according to the output image, wherein the processor further selects a seed pixel from the second image, performs a region-growing process on the selected seed pixel as a center, and determines whether one or more neighboring pixels of the seed pixels have similar characteristics as the seed pixel, in response to the neighboring pixels of the seed pixels having similar characteristics as the seed pixel, the processor labels the seed pixel and the neighboring pixels having the similar characteristics as the same region, selects one of the neighboring pixels in the same region as a new seed pixel, uses the new seed pixel as the center to detect pixels around the new seed pixel that haven't been classified into any region until all pixels in the second image have been classified.

10. The image-processing apparatus as claimed in claim 9, wherein the processor applies a Butterworth high-pass filter on the CD-SEM image to generate an intermediate image, and applies a Gaussian high-pass filter on the intermediate image to generate the first image.

11. The image-processing apparatus as claimed in claim 9, wherein the processor further applies a Hough transform on the first image to generate the second image.

12. The image-processing apparatus as claimed in claim 9, wherein the processor further performs a connected-component labeling algorithm and a region-growing algorithm on each pixel of the second image in a predetermined order to generate the output image.

13. The image-processing apparatus as claimed in claim 9, wherein the processor further obtains critical-dimension pixel-distance information between different objects in the output image according to a plurality of contours of the objects in the output image, and performs a pixel-to-distance conversion on the critical-dimension pixel-distance information to obtain critical-dimension information, and building the critical-dimension information table according to the obtained critical-dimension information.

14. The image-processing apparatus as claimed in claim 9, wherein the output image comprises contours of a plurality of objects on the semiconductor wafer, the processor further obtains a first layout file associated with the semiconductor wafer, incorporates the contours of the objects into the first layout file to generate a second layout file, calculates critical-dimension information of the semiconductor wafer according to the second layout file, and builds the critical-dimension information table according to the calculated critical-dimension information.

15. The image-processing apparatus as claimed in claim 14, wherein the processor further calculates critical-dimension value of each die on the semiconductor wafer according to the critical-dimension information table, and builds a die critical-dimension table of the semiconductor wafer according to the critical-dimension value of each die.

16. The image-processing apparatus as claimed in claim 9, wherein the CD-SEM image is photographed by a critical-dimension scanning electron microscope (CD-SEM) on a cross section of the semiconductor wafer.

17. A method for measuring critical dimension, comprising:

receiving a critical-dimension scanning electron microscopy (CD-SEM) image of a semiconductor wafer;

performing an image-sharpening process and an image de-noise process on the CD-SEM image to generate a first image;

performing an edge-detection process on the first image to generate a second image;

performing a connected-component labeling process on the second image to generate an output image; and calculating a critical-dimension information table of the semiconductor wafer according to the output image, wherein the steps of calculating the critical-dimension information table of the semiconductor wafer according to the output image comprises:

obtaining critical-dimension pixel-distance information between different objects in the output image according to a plurality of contours of the objects in the output image;

performing a pixel-to-distance conversion on the critical-dimension pixel-distance information to obtain critical-dimension information; and building the critical-dimension information table according to the obtained critical-dimension information.

18. The method as claimed in claim 17, wherein the connected-component labeling process comprises:

performing a connected-component labeling algorithm and a region-growing algorithm on each pixel of the second image in a predetermined order to generate the output image.

19. The method as claimed in claim 17, wherein the output image comprises contours of a plurality of objects on the semiconductor wafer, and the method further comprising:

obtaining a first layout file associated with the semiconductor wafer;

incorporating the contours of the objects into the first layout file to generate a second layout file;

calculating critical-dimension information of the semiconductor wafer according to the second layout file; and building the critical-dimension information table according to the calculated critical-dimension information.

20. The method as claimed in claim 19, further comprising:

calculating critical-dimension value of each die on the semiconductor wafer according to the critical-dimension information table; and building a die critical-dimension table of the semiconductor wafer according to the critical-dimension value of each die.

* * * * *